United States Patent
Zhu et al.

(10) Patent No.: US 9,928,767 B2
(45) Date of Patent: Mar. 27, 2018

(54) SYSTEM AND METHOD FOR TESTING CHIP-ON-GLASS BONDING QUALITY

(71) Applicant: Futurewei Technologies, Inc., Plano, TX (US)

(72) Inventors: Xiangan Zhu, San Diego, CA (US); Guoping Luo, Espoo (FI); Qian Han, San Diego, CA (US); Shunlin Chen, Shenzhen (CN); Guangrong Wu, Shenzhen (CN); Jose Garcia, La Mesa, CA (US); Steven R. Loza, Menifee, CA (US); Chuanning Chen, Shenzhen (CN)

(73) Assignee: Futurewei Technologies, Inc., Plano, TX (US)

( * ) Notice: Subject to any disclaimer, the term of this patent is extended or adjusted under 35 U.S.C. 154(b) by 193 days.

(21) Appl. No.: 14/988,361

(22) Filed: Jan. 5, 2016

(65) Prior Publication Data
US 2017/0193870 A1   Jul. 6, 2017

(51) Int. Cl.
*G01R 31/26* (2014.01)
*G09G 3/00* (2006.01)
*G02F 1/13* (2006.01)

(52) U.S. Cl.
CPC ......... *G09G 3/006* (2013.01); *G01R 31/2644* (2013.01); *G02F 1/1309* (2013.01)

(58) Field of Classification Search
CPC ......... G01R 31/02; G01R 31/26–31/27; G01R 1/025; G01R 1/02; G01R 1/24; G01R 1/04; G01R 1/0416; G01R 1/0425; G01R 1/0433; G01R 1/0483; G09G 5/006; G09G 2310/027; G09G 2310/0291; G09G 2310/0264; G09G 3/006; G09G 3/36; G09G 3/3648; G09G 3/3696; G09G 2370/14; G09G 2330/12; G09G 2330/00; G09F 13/005; G09F 13/22; H01R 31/06
USPC .................. 324/756.05, 756.07, 760.01, 538
See application file for complete search history.

(56) References Cited

U.S. PATENT DOCUMENTS

| | | | |
|---|---|---|---|
| 6,940,300 B1 * | 9/2005 | Jenkins | G09G 3/006 324/754.03 |
| 2004/0124868 A1 | 7/2004 | Lim | |
| 2004/0145052 A1 | 7/2004 | Ueno et al. | |
| 2010/0295567 A1 * | 11/2010 | Chang | G01R 31/046 324/719 |
| 2012/0161660 A1 * | 6/2012 | Joo | G09G 3/20 315/240 |
| 2012/0161805 A1 * | 6/2012 | Jung | G09G 3/006 324/754.07 |

(Continued)

*Primary Examiner* — Thang Le
(74) *Attorney, Agent, or Firm* — Slater Matsil, LLP

(57) ABSTRACT

A system and method of testing chip-on-glass (COG) bonding quality automatically includes a glass panel comprising two test pads, the test pads electrically interconnected, a display driver comprising an input node and an output node, and an adhesive layer between the glass panel and the display driver, the adhesive layer binding the glass panel with the display driver, the adhesive layer comprising conductive portions across the adhesive layer between the glass panel and the display driver, wherein the input node, the output node, the two test pads, and the conductive portions are electrically connected to form an electrical testing loop, the electrical testing loop configured to measure a voltage drop across the conductive portions.

13 Claims, 5 Drawing Sheets

(56) References Cited

U.S. PATENT DOCUMENTS

2014/0117998 A1\* 5/2014 Hwang .................. G09G 3/006
324/511
2016/0203777 A1\* 7/2016 Brahma ............... G01R 27/205
345/211

\* cited by examiner

SYSTEM AND METHOD FOR TESTING CHIP-ON-GLASS BONDING QUALITY

TECHNICAL FIELD

The present invention relates generally to testing device displays, and in particular embodiments, to techniques and mechanisms for testing chip-on-glass (COG) bonding quality automatically.

BACKGROUND

In liquid crystal display (LCD) devices, LCD panels are driven by an LCD display driver. This LCD display driver is often an integrated circuit (IC) that is electrically coupled to display elements that control light modulating properties of liquid crystals. The LCD display driver is typically electrically connected to the LCD panel. Traditional techniques for connecting the LCD display driver to the LCD panel include chip on board (COB), tape automatic bonding (TAB), or chip on foil (COF). Traditional connection techniques typically result in multiple components that must be connected with a flexible film. As a result, LCD devices manufactured with traditional techniques may be expensive and bulky. COG mounting is an alternative to SMD mounting that directly mounts the LCD display driver to an overlapping edge of one of the glass panels that make up the LCD panel.

When manufacturing COG mounted LCD devices, the LCD driver is connected to a glass panel through an adhesive interconnect, e.g., anisotropic conductive film (ACF). Such an adhesive may contain electrically conductive elements, e.g., metal balls. A LCD driver has many electrical contacts for interfacing the driver IC to the LCD panel. Conductive elements in an adhesive interconnect may form electrical connections when a driver IC is pushed into the adhesive and against an LCD panel. The LCD driver may thus be adhered to the glass panel while electrical connections are simultaneously formed in the adhesive.

The electrical contact points of an adhered LCD driver are typically tested for quality assurance (QA) purposes. One such method of testing is automatic optical inspection (AOI), which uses a camera to scan the COG bond and check the quantity and shape of metal balls in the ACF. Unfortunately, AOI is slow and unreliable, often resulting in false positives. Thus, faster and more reliable techniques to test the electrical contact points for a mounted LCD driver are desired.

SUMMARY OF THE INVENTION

Technical advantages are generally achieved, by embodiments of this disclosure which describe a system and method for testing chip-on-glass bonding quality automatically.

In accordance with an embodiment, a device includes a glass panel comprising two test pads, the test pads electrically interconnected, a display driver comprising an input node and an output node, and an adhesive layer between the glass panel and the display driver, the adhesive layer binding the glass panel with the display driver, the adhesive layer comprising conductive portions across the adhesive layer between the glass panel and the display driver, wherein the input node, the output node, the two test pads, and the conductive portions are electrically connected to form an electrical testing loop, the electrical testing loop configured to measure a voltage drop across the conductive portions.

In accordance with another embodiment, a method includes providing a test voltage to an input of an electric testing circuit for a chip-on-glass (COG) bond, the electric testing circuit including a plurality of conductive portions across the COG bond, the electric testing circuit associated with a threshold voltage based a quantity of the conductive portions in the electric testing circuit, accessing a result voltage from an output of the electric testing circuit, identifying a voltage difference between the test voltage and the result voltage, and indicating a low quality of the COG bond in response to the voltage difference exceeding the threshold voltage.

In accordance with yet another embodiment, a device includes a display panel comprising a plurality of display test points, each of the display test points including two test pads, the test pads electrically interconnected, a display driver on the display panel and over the display test points, the display driver comprising an input node, an output node, and a plurality of driver test points, each of the driver test points comprising two driver bumps, the driver bumps electrically interconnected, and an adhesive interconnect interjacent the display panel and the display driver, the adhesive interconnect comprising a plurality of conductive portions, the conductive portions connecting the input node, the output node, the test pads, and the driver bumps in series to form a continuous electrical loop.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Disclosed herein is a system and method for testing chip-on-glass bonding quality. Electrical connections may be formed in an ACF layer when pressure and/or heat are applied to the ACF layer. An ACF layer contains metal balls, which connect to form an electrical connection between two contacts pressing on opposite sides of the ACF layer. The quantity and shape of the metal balls trapped between the contacts can affect the quality of the electrical connection formed between those contacts. For example, a connection with relatively few metal balls, or a connection with relatively heavily or lightly deformed metal balls may be more likely to form a weak electrical connection.

Embodiment COG bonds include an automated electric testing circuit for testing electrical connections in an ACF layer. A first portion of a testing circuit may be formed in a glass panel for an LCD, and a second portion of the testing circuit may be formed in an LCD display driver that is bound to the glass panel. Once the COG bond is formed, a test signal may be applied to an input node of the testing circuit. Because the interconnects between the first portion and the second portion of the testing circuit are formed by the COG bond, a signal measured at an output node of the testing circuit may indicate a relative quality of the COG bond, and be used to determine whether a given COG bond satisfies the manufacturing quality control criteria.

Directly measuring an electrical signal may be a faster way of testing a COG bond than optically scanning an electrical connection. Further, direct measurement of an electrical signal may be more accurate; up to 0.3% of tested panels pass AOI but fail electrical testing after further LCD assembly is performed. As a result, fewer LCD modules exhibiting reliability and/or performance issues may be shipped. Testing costs may also be reduced, as measuring an electrical signal is cheaper and faster than optically inspecting an ACF layer to count the quantity and shape of metal balls. Finally, defects may be discovered earlier in the LCD manufacturing process, since automated electric testing may allow a COG bond to be tested before further LCD assembly is performed, e.g., before a LCD backlight is attached or a driving board is assembled. Detecting defects earlier in the manufacturing process may reduce overall costs of LCD products.

Figure 1:
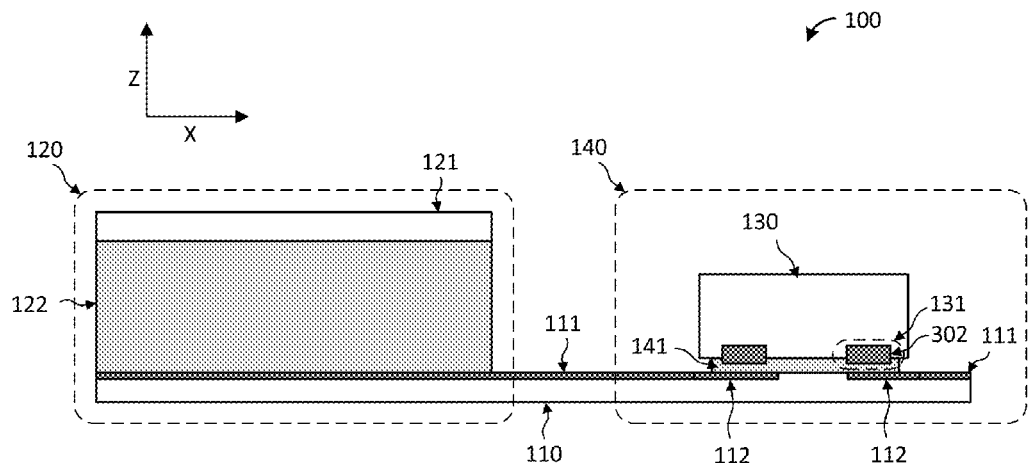
FIG. 1 illustrates an embodiment LCD.

FIG. 1 illustrates a LCD 100. FIG. 1 is shown in the X-Z direction. The LCD 100 includes back glass 110, a LCD panel 120, a LCD driver 130, and a LCD COG bond 140. The LCD 100 may be a display on various devices, such as a smartphone, tablet, desktop computer, wearable device, television, or any device with a display or touch panel. It should be appreciated that, while the present discussion is presented in the context of LCD displays, COG bonding has applications in a wide variety of fields. Embodiments may include any products manufactured with adhesive interconnect glues or tapes.

The back glass 110 includes conductive lines 111 and display test points 112. The conductive lines 111 may be laid down on the back glass 110, to connect the LCD driver 130 to the LCD panel 120. The conductive lines 111 may extend from the LCD panel 120 to the edge of the back glass 110, where the LCD driver 130 is mounted. The conductive lines 111 may also extend to other devices on the back glass 110. The display test points 112 are located in the back glass 110 and form part of a first portion of an automated electric testing circuit for testing electrical connections in a COG bond. As will be discussed in further detail below, there may be one or more of the display test points 112 in the back glass 110.

The LCD panel 120 includes front glass 121 and a liquid crystal 122. The front glass 121 may be a panel opposite the back glass 110. The liquid crystal 122 is trapped between the front glass 121 and the back glass 110. It should be appreciated that the LCD panel 120 may include other components, such as transparent electrodes, polarizing filters, glass substrates, reflective surfaces, and the like. These other components are not displayed for the purposes of clarity and concision.

The LCD driver 130 includes driver test points 131. As will be discussed below in more detail, the LCD driver 130 is bonded to the back glass 110 using COG bonding. This allows the LCD driver 130 to be directly connected to the back glass 110, without requiring the LCD driver 130 to be mounted on a separate PCB that is attached to the back glass 110 and the LCD panel 120. The driver test points 131 are formed from a conductive material (e.g., copper, aluminum, gold, etc.), and electrically connect the LCD driver 130 to the conductive lines 111 and the display test points 112.

The LCD COG bond 140 includes an adhesive interconnect 141, which is an adhesive layer that contains conductive metal balls, such as an anisotropic conductive film. When the driver test points 131 are pressed into the adhesive interconnect 141, electrical connections are formed between the driver test points 131 and the conductive lines 111 and/or the display test points 112. The adhesive interconnect 141 may be cured after the LCD driver 130 is mounted to complete the adhesion and the forming of electrical connections, such that the LCD driver 130 is bound to the back glass 110.

Figure 2:
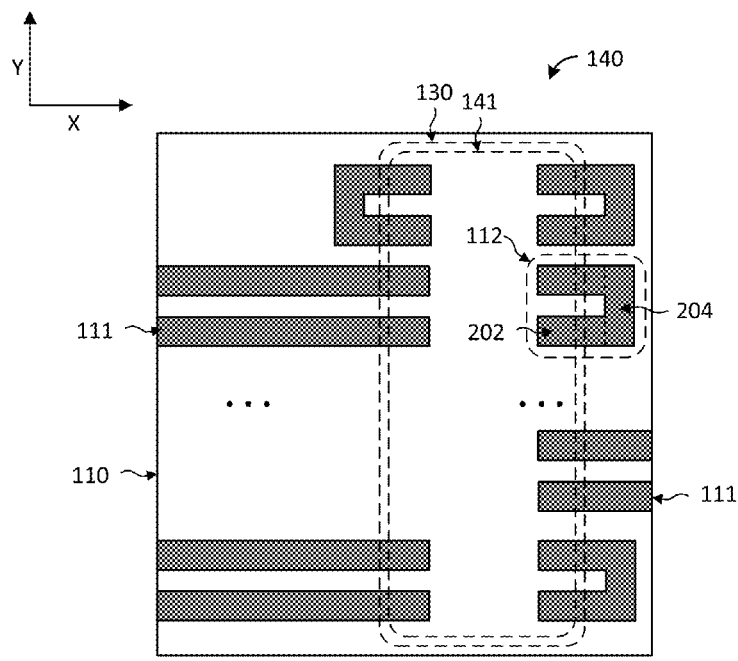
FIG. 2 illustrates an overhead view of an embodiment LCD COG bond.

FIG. 2 illustrates a top-down view of the LCD COG bond 140, in the X-Y direction. As shown, the LCD driver 130 (indicated by a dotted line) is bonded to the back glass 110. The conductive lines 111, display test points 112, and adhesive interconnect 141 (indicated by a dotted line) can be seen in FIG. 2. The conductive lines 111 are laid out on the back glass 110 and connect the LCD panel 120 to the LCD driver 130 and other devices.

As shown in more detail in FIG. 2, each of the display test points 112 on the back glass 110 includes a pair of test pads 202 and an interconnect 204. The test pads 202 and the interconnect 204 are formed from the same material. The interconnect 204 electrically connects consecutive pairs of the test pads 202 to form rings. The interconnect 204 may be formed on the back glass 110 as illustrated in FIG. 2, or may be formed in the back glass 110 (illustrated below in FIG. 4). While four display test points 112 are illustrated in FIG. 2, it should be appreciated that there may be any number of display test points 112 in the back glass 110, and that the quantity of display test points 112 does not necessarily correspond to the quantity of conductive lines 111. The test pads 202 and the interconnect 204 may be formed from any conductive material, such as copper, gold, indium tin oxide (ITO), etc. Each of the display test points 112 are exposed, so that they will be electrically connected to the driver test points 131 of the LCD driver 130 when the adhesive interconnect 141 is cured. The display test points 112 protrude above the back glass 110 so that they push into the adhesive interconnect 141 and form electrical connections when metal balls in the adhesive interconnect 141 are crushed by the driver test points 131.

Figure 3:
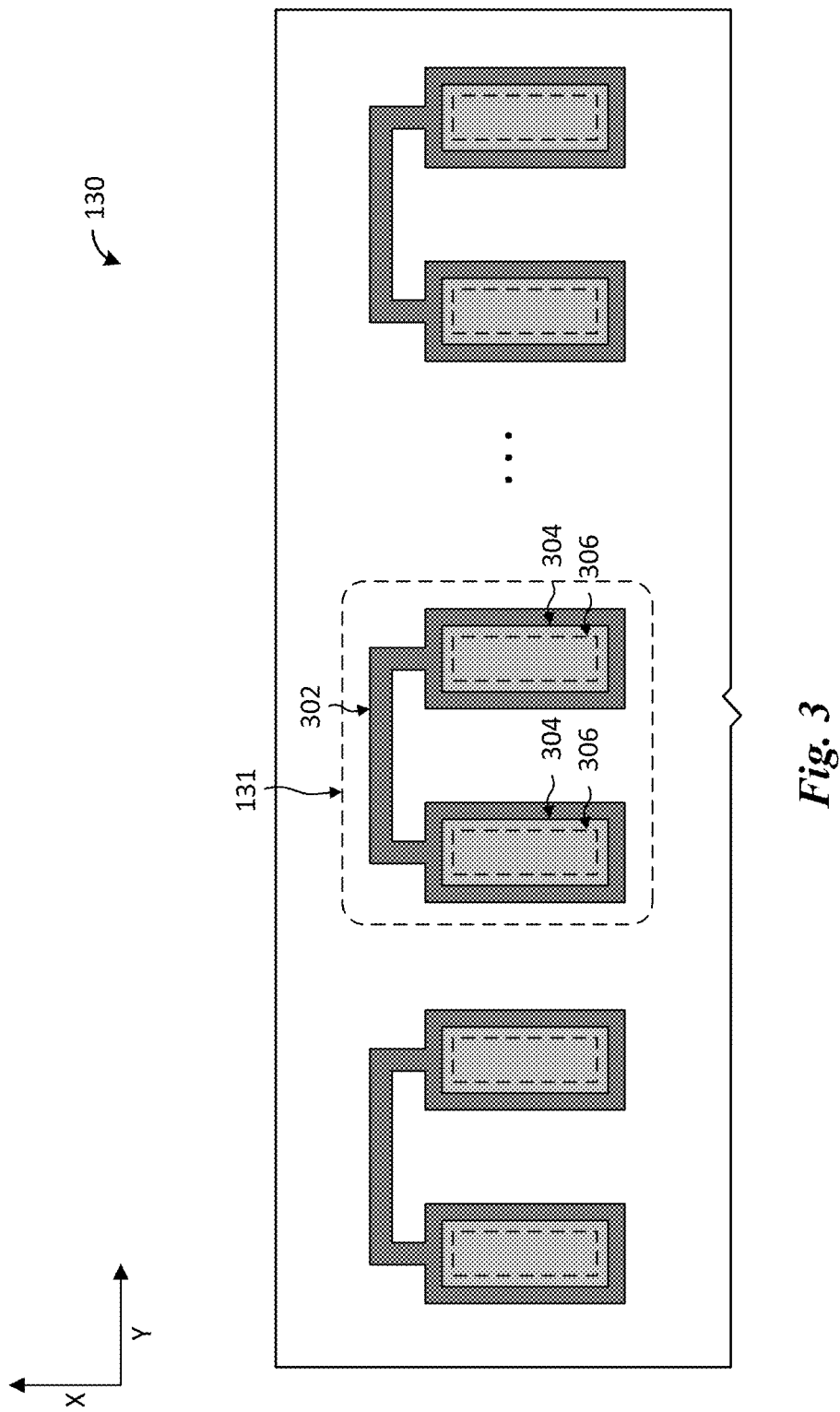
FIG. 3 illustrates a bottom view of an embodiment LCD driver.

FIG. 3 illustrates a bottom view of the LCD driver 130. FIG. 3 is shown in the Y-X direction. As indicated by the broken side line, FIG. 3 only illustrates a portion of the bottom of the LCD driver 130; it should be appreciated that the LCD driver 130 may include other contacts as well, for connecting external devices to different functions in the LCD driver 130. The LCD driver 130 includes one or more driver test points 131, which form part of a second portion of an automated electric testing circuit for testing electrical connections in a COG bond. In some embodiments, the driver test points 131 may be spare nodes on the LCD driver 130 that are not connected to other functions in the LCD driver 130.

As shown in more detail in FIG. 3, each of the driver test points 131 includes a driver pad 302, a pair of driver bumps 304, and passivation layers 306. The driver pad 302 electrically connects consecutive pairs of the driver bumps 304 to form rings. The driver pad 302 may comprise a conductive material. The driver bumps 304 are formed on the driver pad 302 and extend away from the LCD driver 130. The driver bumps 304 may comprise a conductive material. Once the driver bumps 304 have been formed on the driver pad 302, a passivation layer may be formed on the driver bumps 304. While three pairs of driver test points 131 are illustrated in FIG. 3, it should be appreciated that there may be any number of driver test points 131 in the LCD driver 130. In some embodiments, the driver bumps 304 may be unused pins of the LCD driver 130, e.g., pins that do not connect to other functionality in the LCD driver 130.

Figure 4:
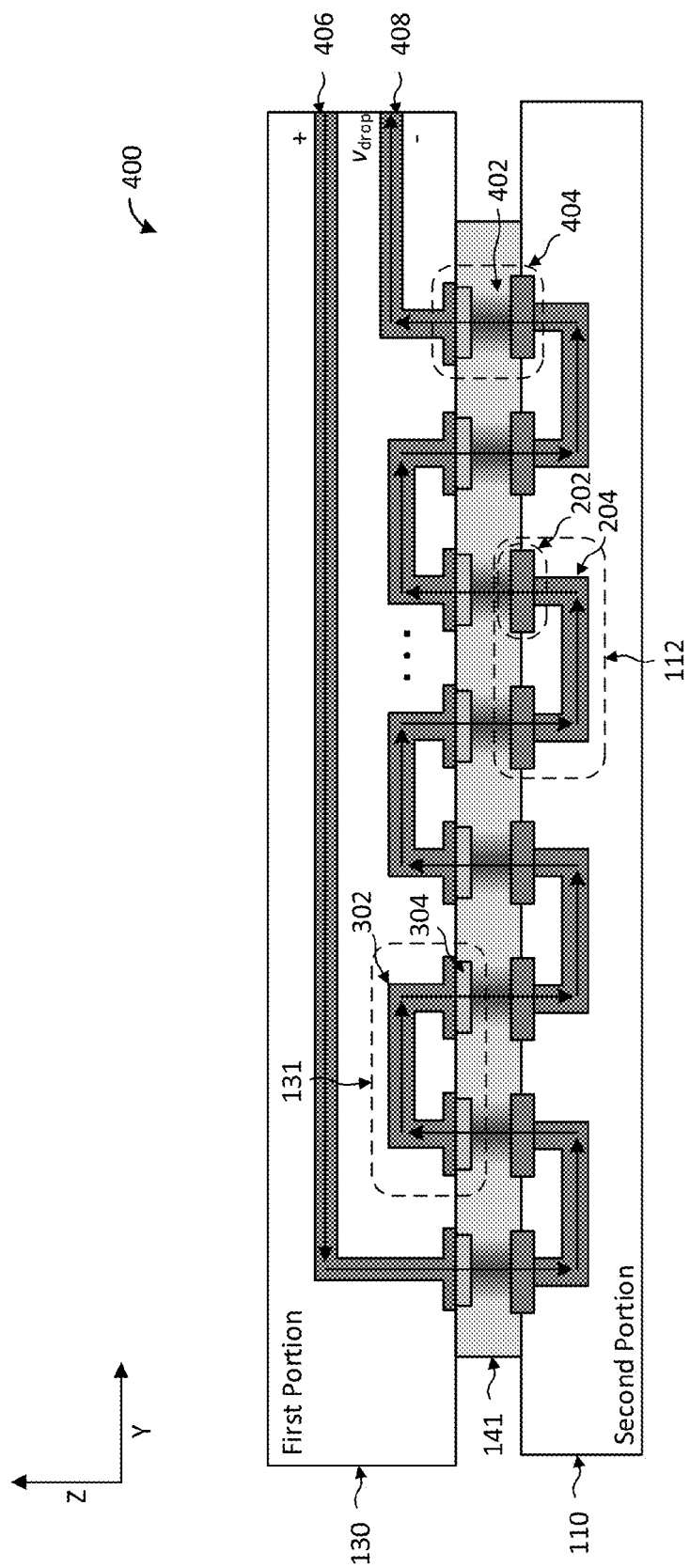
FIG. 4 illustrates a side view of an embodiment electric testing circuit for an LCD COG bond.

FIG. 4 illustrates a side view of an electric testing circuit 400 for the LCD COG bond 140, in the Y-Z direction. As shown, the LCD driver 130 is bonded to the back glass 110. The electric testing circuit 400 for the LCD COG bond 140 comprises a first portion, formed in the back glass 110, and a second portion, formed in the LCD driver 130. The adhesive interconnect 141 has been cured to create electrically conductive portions 402, as indicated by the shaded grey portions of the adhesive interconnect 141. The electrically conductive portions 402 connect the display test points 112 to the driver test points 131, forming test nodes 404. Each of the test nodes 404 includes one of the test pads 202, one of the driver bumps 304, and an electrically conductive portion 402. As illustrated in FIG. 4, the test pads 202 may include protrusions extending out of the back glass 110 and into the adhesive interconnect 141. Likewise, the driver bumps 304 may also extend into the adhesive interconnect 141.

The voltage drop over the electrically conductive portions 402 depends on the bond quality of the adhesive interconnect 141. Imperfections and defects in manufacturing processes may form poor quality bonds, resulting in voltage drops over the electrically conductive portions 402 that exceed a voltage threshold specified by the manufacturer. Accordingly, when a low quality bond is formed, there may be a relatively higher voltage drop across the test nodes 404. In other words, the size of a voltage drop across a test node 404 may indicate the quality of the bond created by the cured adhesive interconnect 141, e.g., the electrically conductive portions 402.

The LCD driver 130 is bonded to the back glass 110 such that alternating pairs of the driver test points 131 and the display test points 112 connect in series to form the test nodes 404. Thus, each of the test nodes 404 may be wired together in a daisy chain fashion to form one electrically continuous sequence (or "electrical testing loop"), as indicated by the flow arrows in FIG. 4. The loop is formed such that it has an input node 406 and an output node 408. Because the test nodes 404 are wired together in series, a test voltage may be applied to the input node 406, and a result voltage may be detected at the output node 408. The result voltage may then be compared to the test voltage. A voltage drop, $v_{drop}$, between the input node 406 and the output node 408 thus represents a cumulative voltage drop across all of the test nodes 404. The voltage drop may then be compared to a predefined threshold in order to determine if the quality of the LCD COG bond 140 is good. In an embodiment the maximum voltage drop indicating a good bond may be between about 3 V and about 5 V. Accordingly, in an embodiment, bad bonds may result in a voltage drop of more than 5 V.

Although FIG. 4 illustrates the test nodes 404 connected to form a single loop, it should be appreciated that several loops could be formed. For example, in another embodiment, an automated electric testing circuit may have a plurality of input nodes 406, output nodes 408, and loops formed with test nodes 404.

While the electric testing circuit 400 illustrated in FIG. 4 has eight test nodes 404, it should be appreciated that more or less test nodes 404 may be formed. In some types of bad bonds, metal balls in the adhesive interconnect 141 may not form a complete connection, resulting in an open circuit across the test nodes 404. Thus, a bad bond may be detected with relatively few or even one of the test nodes 404. However, in other types of bad bonds, the metal balls in the 141 may form poor but complete connections, resulting in a voltage drop across the test nodes 404. Such a voltage drop may be small, even for bad bonds. Thus, increasing the quantity of test nodes 404 in the electric testing circuit 400 accumulates more voltage drops, such that a discernable voltage drop may be measured at the output node 408 and compared to a voltage drop threshold. Accordingly, some embodiments may increase the quantity of nodes 404. In an embodiment the quantity of test nodes 404 may be between about five and about twenty.

Figure 5:
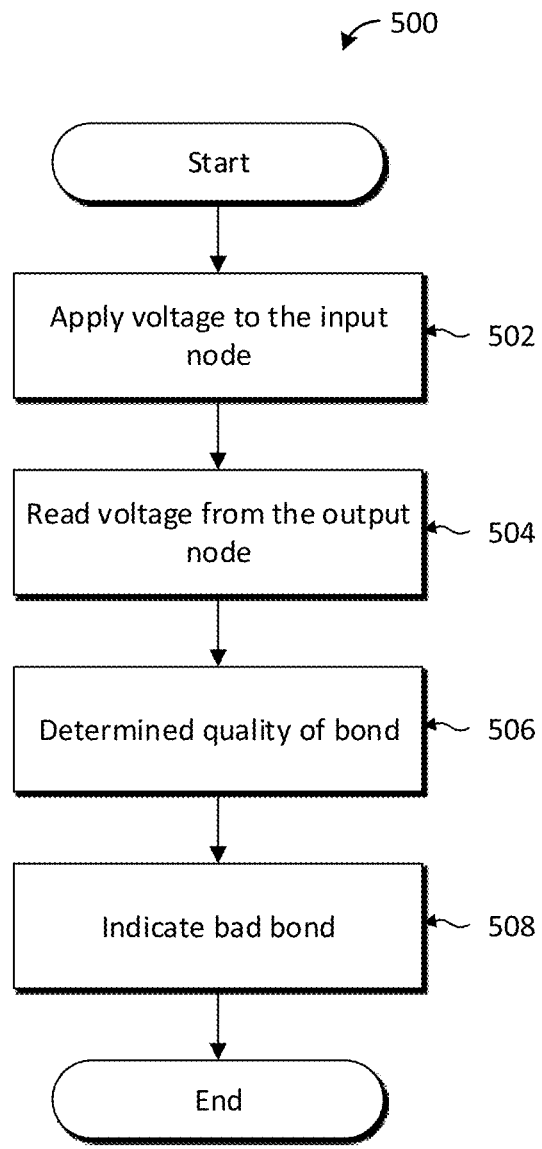
FIG. 5 illustrates an automated method for testing a LCD COG bond.

FIG. 5 illustrates an automated method 500 for testing a LCD COG bond. The automated method 500 may be indicative of operations occurring when operating an electric testing circuit 400. The automated method 500 starts by applying a voltage to the input node, in step 502. The automated method 500 continues by reading a voltage from the output node, in step 504. The input node and the output node may be nodes of a testing loop. The automated method 500 continues by determining quality of a bond, in step 506. In some embodiments, quality of a bond may be determined by comparing the voltage drop between the input and output nodes to a predefined threshold voltage. If the voltage drop is less than the threshold voltage, then a good bond may be indicated. In some embodiments, determining whether a bond is bad may also include considering the quantity of test nodes in a testing loop when comparing the measured voltage drop to the predefined threshold. If a low quality bond was detected, then the automated method 500 concludes by indicating a bad bond, in step 508.

In some embodiments, the automated method 500 may be performed by an LCD display driver itself, e.g., the LCD driver 130. The input node 406 and the output node 408 may be interfaced directly to a voltage detector or comparator within the LCD driver 130. The LCD driver 130 may apply the test voltage to the electric testing circuit 400 and perform the comparison itself, saving resulting data on registers or other data storage mechanisms in the LCD driver 130. The stored voltage drop data may then be read or accessed in various ways, in order to more quickly ascertain the bonding/connection quality. Fully automating the testing of COG bonds by the LCD driver 130 may further increase process automation in manufacturing.

While the above discussion has been presented in the context of measuring voltage drops, it should be appreciated that other metrics could also be tested and measured in the automated testing devices and methods discussed. In some embodiments, current may be measured and compared instead of voltage.

Figure 6:
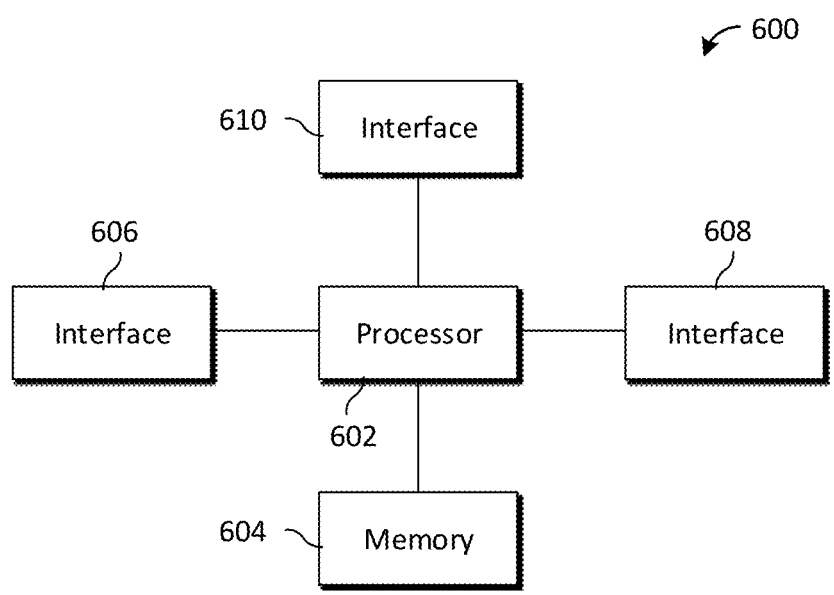
FIG. 6 illustrates a block diagram of an embodiment processing system.

FIG. 6 illustrates a block diagram of a processing system 600 for performing methods described herein, which may be installed in a host device. As shown, the processing system 600 includes a processor 602, a memory 604, and interfaces 606, 608, 610, which may (or may not) be arranged as shown in FIG. 6. The processor 602 may be any component or collection of components adapted to perform computations and/or other processing related tasks, and the memory 604 may be any component or collection of components adapted to store programming and/or instructions for execution by the processor 602. In an embodiment, the memory 604 includes a non-transitory computer readable medium. The interfaces 606, 608, 610 may be any component or collection of components that allow the processing system 600 to communicate with other devices/components and/or a user. For example, one or more of the interfaces 606, 608, 610 may be adapted to communicate data, control, or management messages from the processor 602 to applications installed on the host device and/or a remote device. As another example, one or more of the interfaces 606, 608, 610 may be adapted to allow a user or user device (e.g., personal computer (PC), etc.) to interact/communicate with the processing system 600. The processing system 600 may include additional components not depicted in FIG. 6, such as long term storage (e.g., non-volatile memory, etc.).

In some embodiments, the processing system 600 is included in a network device that is accessing, or part otherwise of, a telecommunications network. In one example, the processing system 600 is in a network-side device in a wireless or wireline telecommunications network, such as a base station, a relay station, a scheduler, a controller, a gateway, a router, an applications server, or any other device in the telecommunications network. In other embodiments, the processing system 600 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A device comprising:
    a display panel comprising a plurality of display test points, each of the display test points including two test pads, the test pads electrically interconnected;
    a display driver on the display panel and over the display test points, the display driver comprising an input node, an output node, and a plurality of driver test points, each of the driver test points comprising two driver bumps, the driver bumps electrically interconnected; and
    an adhesive interconnect interjacent the display panel and the display driver, the adhesive interconnect comprising a plurality of conductive portions, the conductive portions connecting the input node, the output node, the test pads, and the driver bumps in series to form a continuous electrical loop.

2. The device of claim 1, wherein each of the display test points is connected to a first one of the driver bumps, and one of the input node, the output node, or a second one of the driver bumps.

3. The device of claim 1, wherein the plurality of conductive portions connects the driver test points and the display test points in an alternating sequence to form the continuous electrical loop.

4. The device of claim 1, wherein the display test points comprise unused pins of the display driver.

5. The device of claim 1, wherein there are between 5 and 10 display test points.

6. The device of claim 1, wherein the adhesive interconnect comprises:
    an adhesive compound; and
    a plurality of conductive metal balls in the adhesive compound, subsets of the conductive metal balls contacting to form the conductive portions.

7. The device of claim 1, wherein the display driver further comprises:
    a comparator, the input node and the output node electrically connected to the comparator; and
    a register coupled to the comparator, the register storing an output of the comparator.

8. The device of claim 7, wherein the display driver is configured to indicate a low quality of the conductive portions in response to the output of the comparator exceeding a threshold.

9. The device of claim 1, further comprising:
    a glass panel, the display panel disposed on the glass panel; and
    a plurality of conductive lines on the glass panel, the conductive lines coupling the display driver to the display panel, the conductive lines different from the test pads.

10. The device of claim 9, wherein the glass panel and the display driver form a chip-on-glass (COG) bond.

11. The device of claim 10, wherein the display driver is configured to:
    provide a test voltage to the input node;
    access a result voltage from the output node;
    identify a voltage difference between the test voltage and the result voltage; and
    indicate a low quality of the COG bond in response to the voltage difference exceeding a threshold voltage.

12. The device of claim 11, wherein the threshold voltage is based a quantity of the conductive portions in the COG bond, and an expected voltage drop across the conductive portions.

13. The device of claim 11, wherein the threshold voltage is between 3 volts and 5 volts.

* * * * *